(12) United States Patent
Kato et al.

(10) Patent No.: US 7,816,674 B2
(45) Date of Patent: Oct. 19, 2010

(54) ORGANIC THIN-FILM TRANSISTOR

(75) Inventors: Takuji Kato, Kanagawa (JP); Tamotsu Aruga, Kanagawa (JP); Daisuke Goto, Kanagawa (JP); Masafumi Torii, Kanagawa (JP); Shinji Matsumoto, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 130 days.

(21) Appl. No.: 11/901,534

(22) Filed: Sep. 17, 2007

(65) Prior Publication Data

US 2008/0067507 A1 Mar. 20, 2008

(30) Foreign Application Priority Data

Sep. 19, 2006 (JP) .............................. 2006-252019
Feb. 5, 2007 (JP) .............................. 2007-024998

(51) Int. Cl.
*H01L 29/08* (2006.01)
(52) U.S. Cl. .......... 257/40; 257/E33.001; 257/E25.008; 438/82; 438/99; 428/690; 313/504; 313/506

(58) Field of Classification Search ............... 257/40, 257/E33.001, E25.008, E51.018, E51.001; 438/82, 99; 428/690, 917; 313/504, 506
See application file for complete search history.

(56) References Cited

U.S. PATENT DOCUMENTS

| 7,105,459 | B2 | 9/2006 | Nishiyama et al. |
| 7,166,689 | B2 | 1/2007 | Sagisaka et al. |
| 7,435,989 | B2 * | 10/2008 | Nakayama et al. ............ 257/40 |
| 2007/0024948 | A1 | 2/2007 | Hirano et al. |
| 2007/0092760 | A1 | 4/2007 | Sagisaka et al. |

FOREIGN PATENT DOCUMENTS

| JP | 5-55568 | 3/1993 |
| JP | 2005-79163 | 3/2005 |
| JP | 2005-101493 | 4/2005 |
| JP | 2005-154709 | 6/2005 |
| KR | 10-2004-0088579 | 10/2004 |

\* cited by examiner

*Primary Examiner*—Hsien-ming Lee
(74) *Attorney, Agent, or Firm*—Cooper & Dunham LLP

(57) ABSTRACT

An organic thin-film transistor, including a layer exposing a benzene ring, having a surface separation of from 2.8 to 3.0 Å; and an organic semiconductive layer located overlying the layer exposing a benzene ring.

10 Claims, 7 Drawing Sheets

ORGANIC THIN-FILM TRANSISTOR

BACKGROUND

1. Technical Field

This disclosure relates to an organic thin-film transistor having an organic semiconductive layer.

2. Discussion of the Related Art

Recently, research and development of organic thin-film transistors using organic semiconductive materials has become popular. Thin films of the organic semiconductive materials can easily be formed simple wet process methods such as printing method and spin coat method. Compared with conventional thin-film transistors using inorganic semiconductive materials, it is advantageous that the organic thin-film transistors can be prepared at a low temperature. Therefore, the organic thin-film transistors can be formed on a plastic board typically having low heat resistance. Then, the weight and cost of electronics devices such as a display can be saved and various applications such as applications taking advantage of the flexibility of the plastic board can be expected.

Japanese Published Unexamined Patent Application No. 5-55568 discloses acene materials such pentacene as the organic semiconductive materials. Although an organic thin-film transistor using the pentacene as the organic semiconductive layer is reported to have comparatively a high transportability, the acene materials have extremely low solubility in generic solvents and need to be subjected to a vacuum deposition process when thinned as the organic semiconductive layer in the organic thin-film transistor. Therefore, this is not as simple as the methods such as printing method and spin coat method mentioned above.

Japanese Published Unexamined Patent Applications Nos. 2005-101493 and 2005-154709 disclose an organic thin-film transistor having an organic semiconductive layer formed of polyarylenevinylene including a site of a triarylamine structure. Having high solubility in the organic solvent, the polyarylenevinylene including a site of a triarylamine structure can form an organic semiconductor with simple printing processes such as inkjet printing, spin coat and gravure printing. In addition, since the polyarylenevinylene including a site of a triarylamine structure forms a uniform coated film, the resultant organic thin-film transistors have less piece-to-piece variations when having a larger area, which is expected therefor. However, the carrier transportability needs to be further increased, which is required for the organic thin-film transistors.

Because of these reasons, a need exists for an organic thin-film transistor having high transportability, which can be prepared simple processes such as coating and printing.

BRIEF SUMMARY

In an aspect of this disclosure, there is provided an organic thin-film transistor having high transportability, which can be prepared by applying simple processes, such as coating and printing.

In another aspect of this disclosure, there is provided an organic thin-film transistor, comprising:

a layer exposing a benzene ring, having a surface separation of from 2.8 to 3.0 Å; and an organic semiconductive layer located overlying the layer exposing a benzene ring.

These and other aspects, features and advantages will become apparent upon consideration of the following description of the preferred embodiments of the present invention taken in conjunction with the accompanying drawings.

DESCRIPTION OF THE PREFERRED EMBODIMENTS

In this disclosure, there is provided an organic thin-film transistor having high transportability, which can be prepared by applying simple processes, such as coating and printing.

More particularly, there is provided an organic thin-film transistor, comprising:

a layer exposing a benzene ring, having a surface separation of from 2.8 to 3.0 Å; and an organic semiconductive layer located overlying the layer exposing a benzene ring.

Figure 1A:
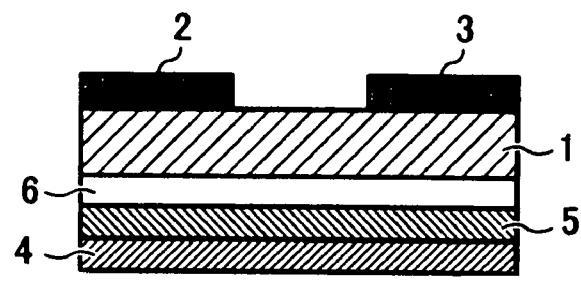
FIGS. 1A to 1C are schematic views illustrating cross-sections of embodiments of layer structure of the organic thin-film transistor of the present invention.
Figure 1B:
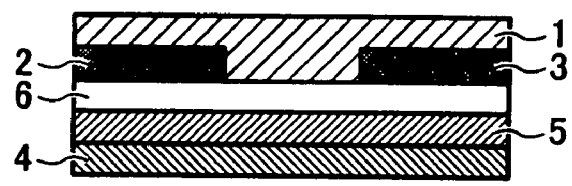
Figure 2A:
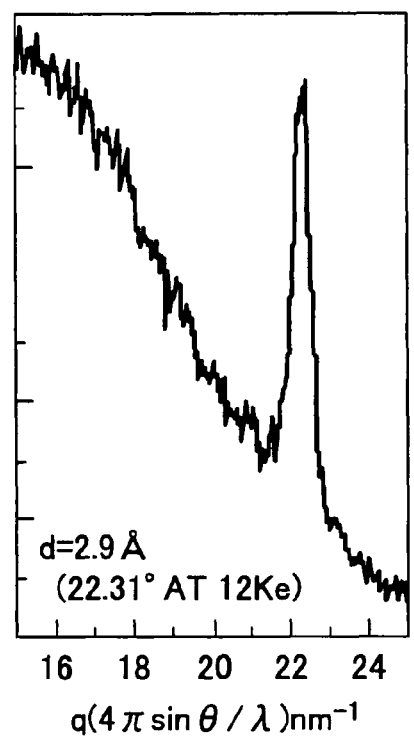
FIGS. 2A and 2B are schematic diagrams illustrating results of GIXD measurements in Examples 1 and Comparative Example 2 of the present invention.
Figure 2B:
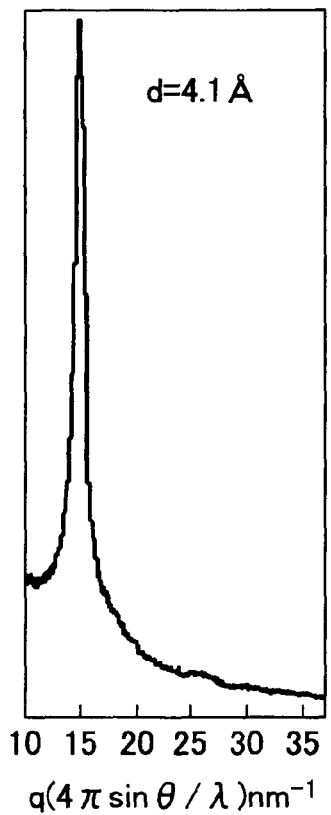
Figure 3:
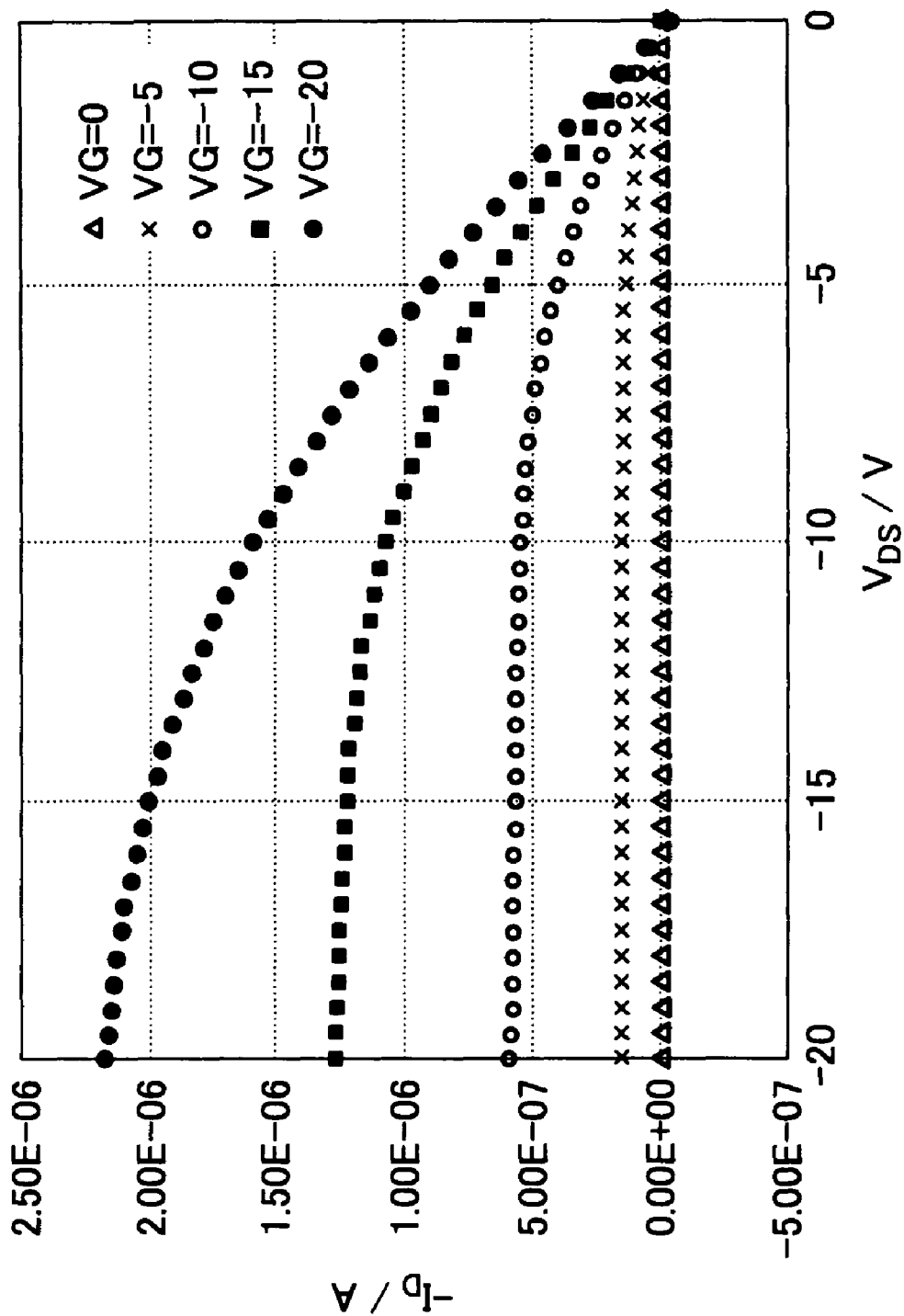
FIG. 3 is a schematic diagram illustrating a FET property of the organic thin-film transistor in Example 1.

Specifically, in the schematic views illustrating cross-sections of layer structure of the organic thin-film transistor, according to embodiments of the present invention in FIGS. 1 to 3, the organic thin-film transistor has a layer (6) exposing a benzene ring, having a surface separation of from 2.8 to 3.0 Å and an organic semiconductive layer (1) located overlying the layer exposing a benzene ring. The organic semiconductive layer (1) mainly includes a polymer having a repeat unit having the following formula (I) or (II):

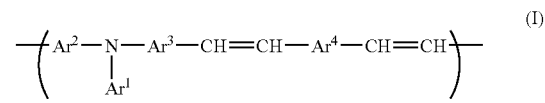

wherein $Ar^1$ represents a substituted or an unsubstituted monovalent aromatic hydrocarbon; $Ar^2$ and $Ar^3$ independently represent a substituted or an unsubstituted bivalent aromatic hydrocarbon; and $Ar^4$ represents a substituted or an unsubstituted aromatic hydrocarbon, or a substituted or an unsubstituted bivalent heterocyclic compound.

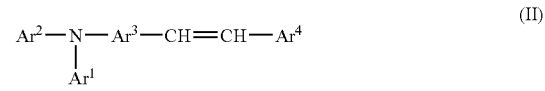

wherein $Ar^1$ represents a substituted or an unsubstituted monovalent aromatic hydrocarbon; $Ar^2$ and $Ar^3$ independently represent a substituted or an unsubstituted bivalent aromatic hydrocarbon; and $Ar^4$ represents a substituted or an unsubstituted aromatic hydrocarbon, or a substituted or an unsubstituted bivalent heterocyclic compound.

The organic thin-film transistor, according to an embodiment of the present invention, includes a spacially-separated source electrode (2), a drain electrode (3), a gate electrode (4), an insulating layer (5) between the gate electrode (4) and the organic semiconductive layer (1), and further the layer (6) exposing a benzene ring between the organic semiconductive layer (1) and the insulating layer (5). A voltage is applied to the gate electrode (4) to control a current passing in the organic semiconductive layer (1) between the source electrode (2) and the drain electrode (3).

The organic thin-film transistor of the present invention can be formed on a substrate such as glass, silicon and plastic. An electroconductive substrate can combine the gate electrode, and further the gate electrode and the electroconductive substrate can be multilayered. However, a plastic sheet is preferably used as a substrate when a device the organic thin-film transistor of the present invention is applied to is required to have flexibility, lightweight, low cost and shock resistance.

Specific examples of the plastic sheet include films formed of polyethyleneterephthalate, polyethylenenaphthalate, polyethersulfone, polyetherimide, polyetheretherketone, polyphenylenesulfide, polyarylate, polyimide, polycarbonate, cellulosetriacetate, celluloseacetatepropionate, etc.

Known organic semiconductive materials can be used in the organic semiconductive layer of the organic thin-film transistor of the present invention. Particularly, the organic semiconductive polymer materials having the formula (I) are preferably used. Specific examples of the organic semiconductive polymer materials having the formula (I) include materials having the following formulae:

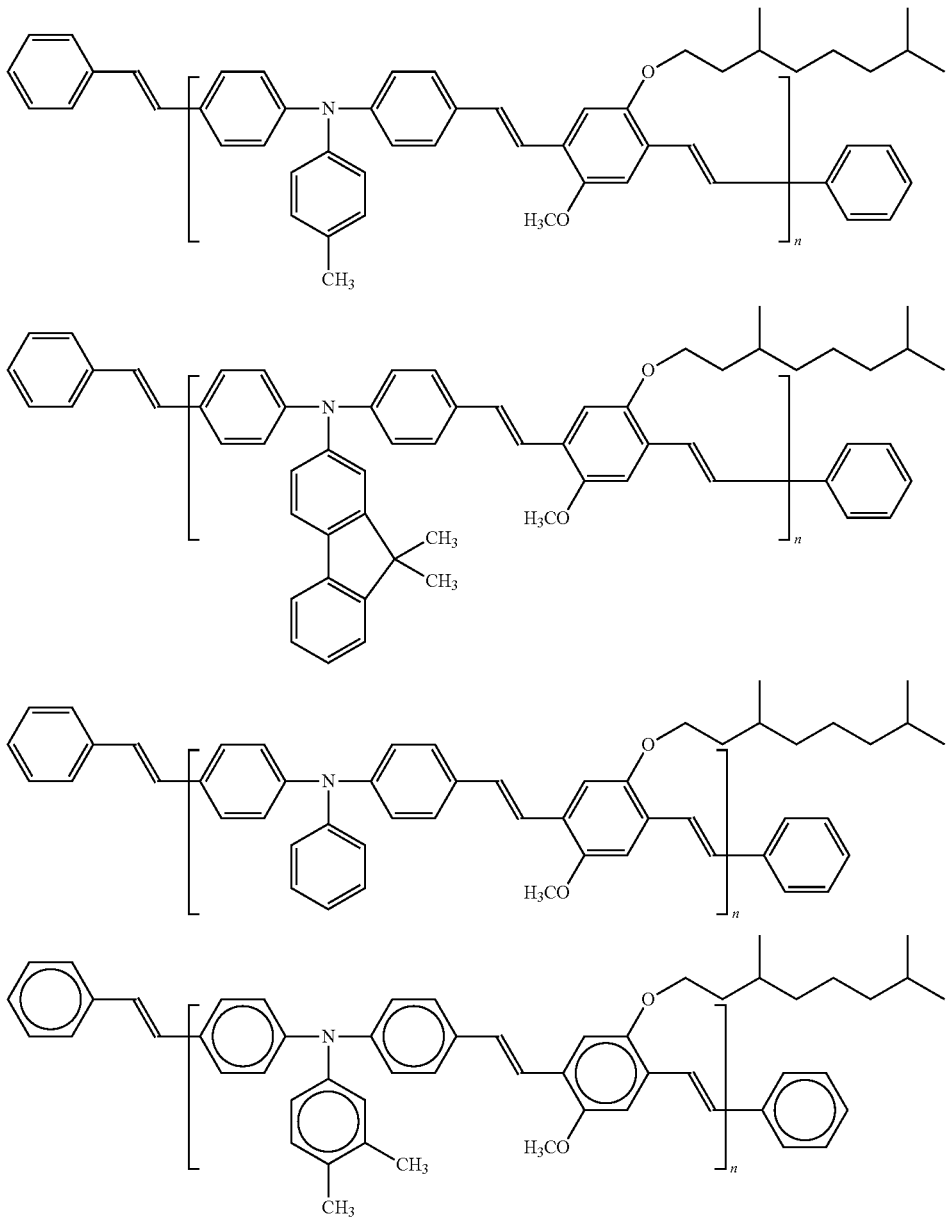

-continued
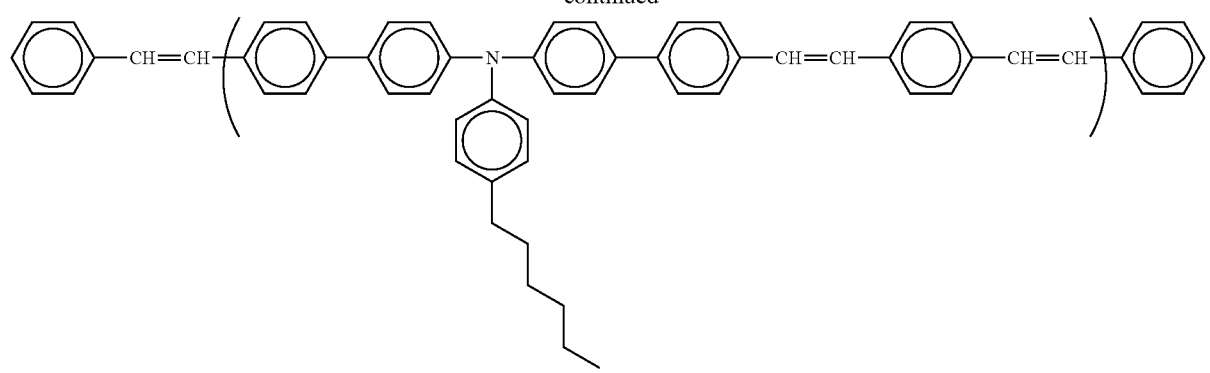
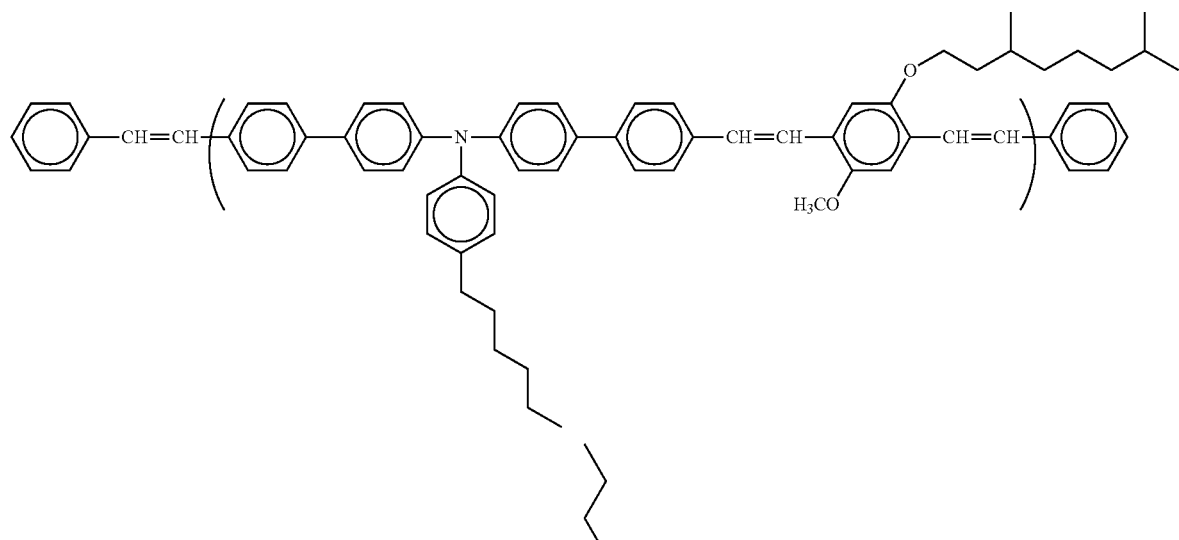
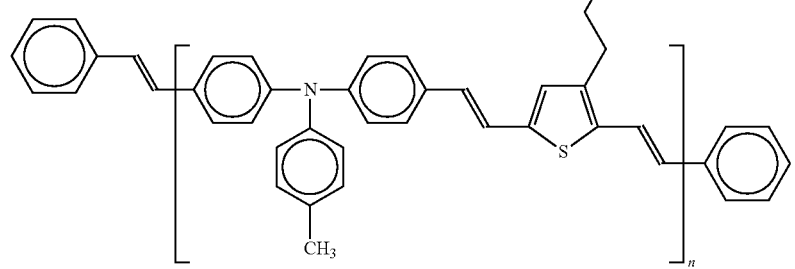
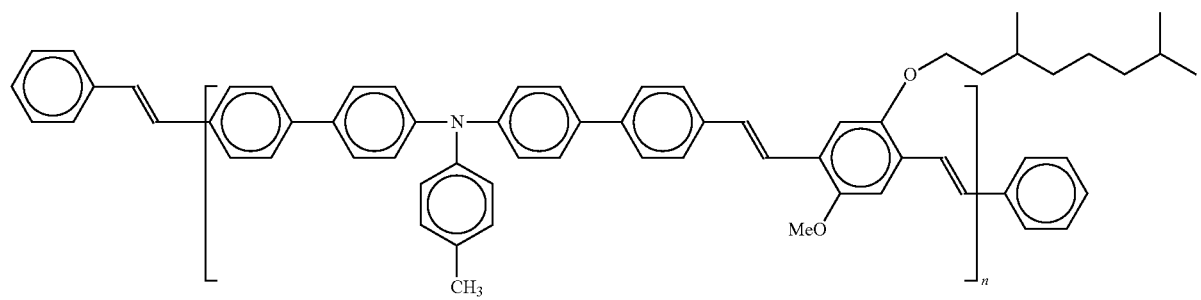

-continued
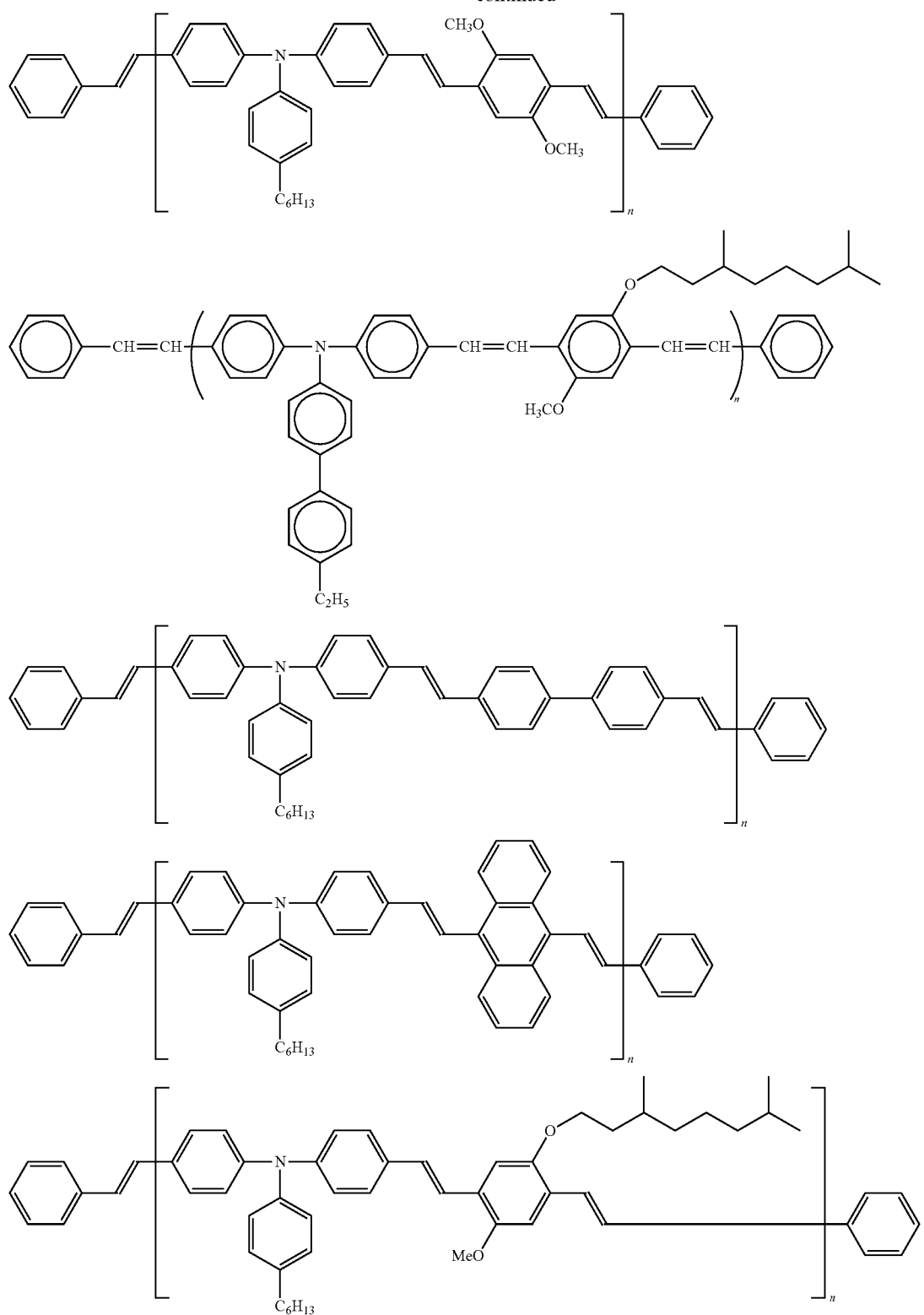

-continued
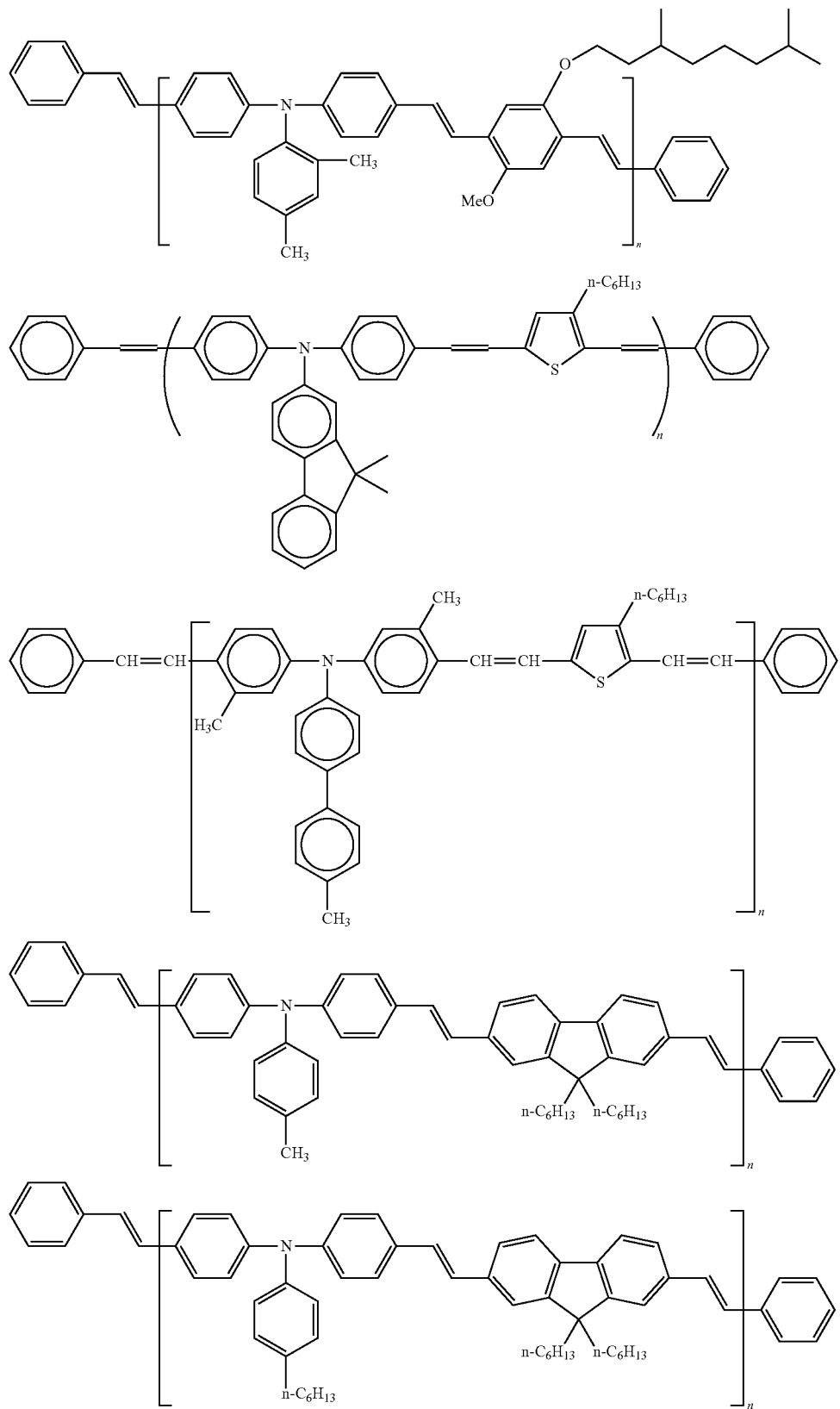

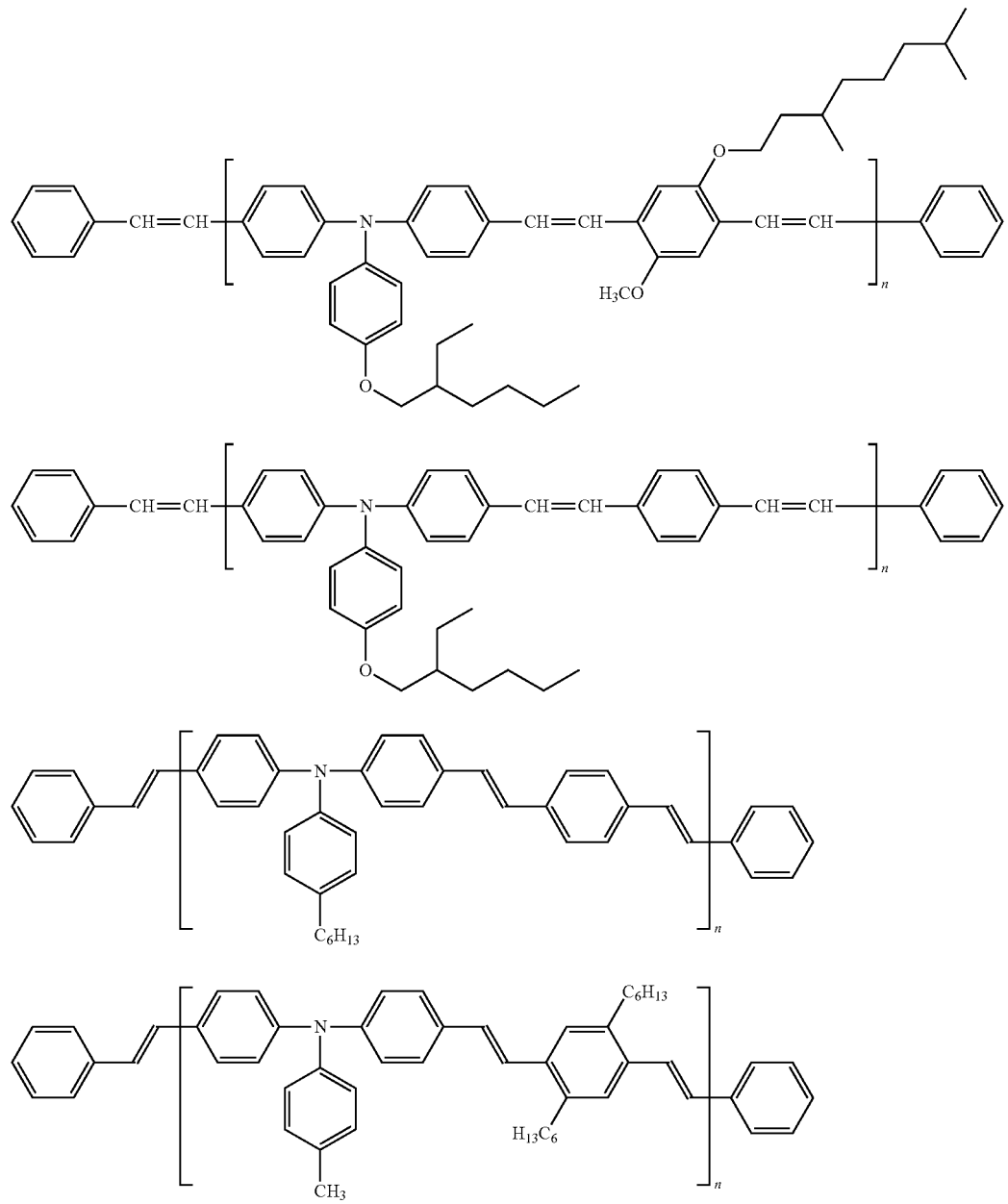

Further, the compound having the formula (II) is mixed with the organic semiconductive polymer materials to increase the transportability. The organic semiconductive layer preferably includes the compound in an amount not greater than 50% by weight, and more preferably from 10 to 50% by weight. When greater than 50% by weight, the glass transition temperature of the organic semiconductive layer noticeably lowers and the organic solvent is insufficiently dried when the organic semiconductive layer is formed by a printing process, resulting in deterioration of layer uniformity.

Specific examples of the compound having the formula (II) include known compounds disclosed in Japanese Patents Nos. 32392424, 3273543, Japanese Published Unexamined Patent Applications Nos. 2004-212959, 2004-302452, etc., having the following formulae:

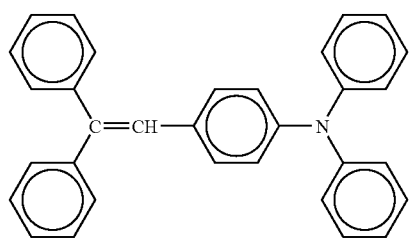

-continued

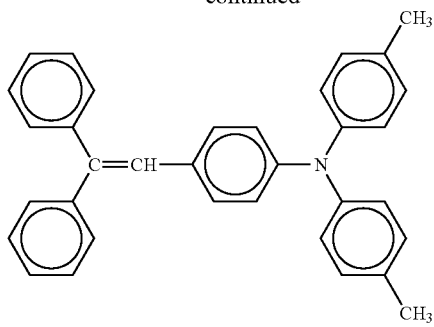

In addition, compounds (not polymers) structurally similar to the site of triarylamine structure in the polymer organic semiconductor formed of polyarylenevinylene disclosed in Japanese Published Unexamined Patent Applications Nos. 2005-101493 and 2005-154709 are also included.

The layer exposing a benzene ring, having a surface separation of from 2.8 to 3.0 Å of the present invention can be formed by, e.g., forming a layer including an organic semiconductive compound on a silane compound film including a hydrolysable group and an aromatic ring group, preferably a benzene ring group. For example, a compound having a silicon-end having a halogen atom, or a substituted or an unsubstituted alkoxy group such as trichlorosilane, dichlorosilane, monochlorosilane, trimethoxysilane, dimethoxysilane, monomethoxysilane, triethoxysilane, diethoxysilane, monoethoxysilane, monobutoxysilane, dibutoxysilane and monobutoxysilane and a benzene ring at the other end is film-formed by a chemisorption method. On this film, the layer including the organic semiconductive compound such as the compounds having the formulae (I) and (II) is formed.

It is particularly preferable that the benzene ring is exposed on $SiO_2$ through an alkyl chain because of higher uniformity. A silane compound having a structure wherein a silicon atom and a benzene ring are connected to each other through an alkyl chain is used to expose the benzene ring through the alkyl chain.

The chemisorption method includes dissolving the silane compound in a solvent such as dichloromethane, tetrahydrofuran, chloroform, toluene, dichlorobenzene and xylene; dipping a substrate therein; and drying the substrate. In order to form the layer exposing a benzene ring, having a surface separation of from 2.8 to 3.0 Å, the substrate is preferably subjected to ultrasonic exposure when dipped in the solvent.

The silane compound is preferably dissolved in the solvent in an amount of from 0.1 to 1,000 mM, and more preferably from 1 to 10 mM. When less than 0.1 mM, the substrate is dipped too long. When greater than 1,000 mM, the layer exposing a benzene ring, having a surface separation of from 2.8 to 3.0 Å cannot uniformly be formed.

The layer exposing a benzene ring, having a surface separation of from 2.8 to 3.0 Å can be identified with a carbon amount determination by X-ray photoelectron spectroscopy, the number of functional groups by infrared absorption spectroscopy and a periodic structure of the monomolecular film by X-ray diffraction. The X-ray diffraction is measured by vision angle incident X-ray diffraction method with Spring8 or BL13. The X-ray has an incident angle of 0.1°, a takeoff angle of 0.1° and an incident energy of 12 keV.

The benzene ring typically has a surface separation of from 3 to 4 Å, and in the present invention, the layer having a surface separation of from 2.8 to 3.0 Å is formed, e.g., by directly attaching a benzene ring to siloxane and the benzene rings face each other at intervals of Si—O—Si, which is proved by the GIXD measurement. This surface separation is unrealizable for low-molecular-weight crystals.

The insulating layer of the present invention includes inorganic insulating materials such as silicon oxide, silicon nitride, aluminum oxide, aluminum nitride, titanium oxide, tantalum oxide, tin oxide, vanadium oxide, barium titanate strontium, barium zirconate titanate, lead zirconate titanate, lead titanate lanthanum, strontium titanate, barium titanate, barium fluoride magnesium, bismuth tantalate niobate and yttrium trioxide. Particularly, $SiO_2$ having a low conductivity is preferably used. In addition, flexible organic materials can also be used. Specific Examples of the organic materials include polymeric compounds such as polyvinylalcohol, polyvinylphenol, polymethacrylate, polymethylmethacrylate, polystyrene, polyimide, polyester, polyethylene, polyphenylenesulfide, unsubstituted or halogen-atom substituted polyparaxylylene, polyacrylonitrile and cyanoethylpullulan. These insulating materials can be used alone or in combination. The materials are not particularly limited, but those having high permittivity and low conductivity are preferably used.

The insulating layer can be formed by dry processes such as CVD method, plasma CVD method, plasma polymerization method and evaporation method; and wet processes such as spray coat method, spin coat method, dip coat method, inkjet method, cast method, blade coat method and barcode method. Further, coated $SiO_2$ can also be used.

The organic semiconductive material of the present invention is dissolved in a solvent such as dichloromethane, tetrahydrofuran, chloroform, toluene, dichlorobenzene and xylene to prepare a solution; and the solution is coated on substrate. The organic semiconductive thin film can be formed by spray coat method, spin coat method, blade coat method, dip coat method, cast method, roll coat method, barcode method, dye coat method, inkjet method, dispense method, etc. A suitable method and a suitable solvent are selected depending on materials.

The organic semiconductive layer has a thickness not particularly limited, but uniform not greater than 1 μm, and more preferably from 5 to 200 nm.

The gate electrode, source electrode and drain electrode for use in the present invention are not particularly limited if formed of conductive materials. Specific examples thereof include metals and their alloys such as platinum, gold, silver, nickel, chrome, copper, iron, tin, antimony, lead, tantalum, indium, aluminum, zinc and magnesium; conductive metal oxides such as indium and tin oxide; and inorganic and organic semiconductive materials having improved conductivities, which are subjected to doping, etc. such as silicon monocrystal, polysilicon, amorphous silicon, germanium, graphite, polyacetylene, polyparaphenylene, polythiophene, polypyrrole, polyaniline, polythienylenevinylene, polyparaphenylenevinylene and a complex of polyethylenedioxythiophene and polystyrenesulfonate. The conductive materials of the source electrode and drain electrode preferably have less electric resistivity at a surface contacting the semiconductive layer.

The electrode is formed by known photolithograph method or liftoff method on a conductive film formed by evaporation or sputtering method using the above-mentioned materials; method of etching metal foils such as an aluminum foil and a copper foil using a resist with thermal transfer, inkjet, etc. A conductive polymer solution or dispersion, or a conductive particulate material dispersion may directly be patterned with inkjet. In addition, the electrode may be formed from a coated film with lithography or laser abrasion, etc. Further, an ink including a conductive polymer or a conductive particulate material, a conductive paste and the like may be patterned by printing methods such as anastatic printing, intaglio printing, planographic printing and screen printing.

The organic thin-film transistor of the present invention may optionally have an extraction electrode from each of the electrodes.

In addition, the organic thin-film transistor of the present invention may optionally have a protection layer in order to be protected from mechanical destruction, water and gas and device accumulation although stably working even in the atmosphere.

The organic thin-film transistor of the present invention can be used as an element for driving a display image element such as liquid crystal, organic EL and electrocataphoresis. When these are accumulated, a display, so-called an "electronic paper", can be prepared. In addition, an IC which is accumulation of the organic thin-film transistors of the present invention can be used as IC tags.

Having generally described this invention, further understanding can be obtained by reference to certain specific examples which are provided herein for the purpose of illustration only and are not intended to be limiting. In the descriphaving a surface separation of 2.9 Å and a half width not greater than ±0.1 Å can be identified.

In FIGS. 2A and 2B, when the X-ray diffraction is measured, 2θ is typically used for a horizontal axis. When 2θ is a surface separation (d) and a measurement wavelength (λ), a diffraction peak appears at a point where 2d sin θ=λ. When the measurement wavelength (λ) and the diffraction angle θ are fixed, the surface separation d is identified. Cuκα ray having λ of known 1.1418 Å is typically used for the measurement, and 2θ can be used.

However, in terms of balance between a sample damage (low energy damages an organic material) and a measurement range (high energy causes a low angle, resulting in worse angle analyzability even when the surface separation is same), 12 KeV light is used in the present invention. Even when the surface separation is same, 2θ varies when using Cuκα ray (about 8 KeV) and when using 12 KeV and it is possibly difficult to compare various data. Therefore, when light besides Cuκα ray is used, 2θ is not used for the horizontal axis, but q dependent only on the surface separation is used. $q=4\pi \sin \theta/\lambda = 2\pi/d$. q is same if the surface separation is same even when using light having any wavelength. Therefore, $q(=4\pi \sin \theta/\lambda)$ nm$^{-1}$ is used for the horizontal axis.

An organic semiconductive compound having an average molecular weight of 75,000 and the following formula

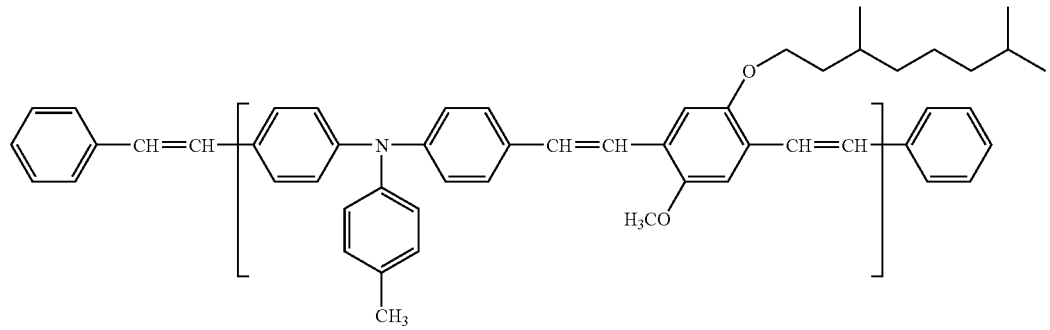

tions in the following examples, the numbers represent weight ratios in parts, unless otherwise specified.

EXAMPLES

Examples of Preparation of Substrate for Organic Thin-Film Transistor

After the surface of a p-doped silicon board (30 mm×30 mm) was thermally-oxidized to form a SiO$_2$ insulating layer having a thickness of 200 nm thereon, one side thereof was covered with a resist film TSMR8800 from Tokyo Ohka Kogyo Co., Ltd. and the insulating layer on the other side thereof is removed with a fluorinated acid. Next, an aluminum layer having a thickness of 300 nm was evaporated on the other side the insulating layer was removed from. Then, the resist film was removed with acetone to form a substrate for organic thin-film transistor.

Example 1

The substrate for organic thin-film transistor prepared as above was dipped in a toluene solution including phenyl-trichlorosilane in an amount of 5 mM for 30 min while exposed with ultrasonic, and dried. The structural analysis of the thus treated substrate is shown in FIG. 2A. A structure was dissolved in a mixed solvent of tetrahydrofuran/paraxy-lene (2/8) in an amount of about 1.0% by weight to prepare a solution. The solution was spin-coated on the substrate and dried to form an organic semiconductive layer having a thickness of 30 nm thereon.

Next, gold was evaporated on the substrate to form a source electrode and a drain electrode having a thickness of 100 nm respectively such that a channel length is 30 μm and a channel width is 10 mm. Thus, an organic thin-film transistor was prepared.

Further, the procedure for preparation of the organic thin-film transistor was repeated to prepare a same organic thin-film transistor to evaluate reproducibility thereof.

Figure 1C:
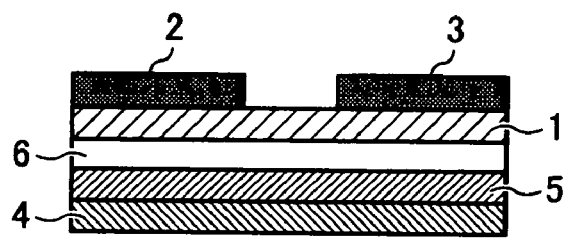

The organic thin-film transistors each had a structure in FIG. 1C, and the p-doped silicon board worked as a gate electrode with the aluminum layer on the other side thereof.

Additional modifications and variations of the present invention are possible in light of the above teachings. It is therefore to be understood that within the scope of the appended claims the invention may be practiced other than as specifically described herein.

The field-effect transportability of thus prepared organic thin-film transistor was measured. The results are shown in FIG. 3.

The field-effect transportability was determined using the following formula:

$$Ids = \mu C_{in} W(Vg-Vth)^2/2L$$

Wherein Cin is a capacitance per unit area of the gate insulating layer; W is a channel width; L is a channel length; Vg is a gate voltage; Ids is a source drain current; μ is transportability; and Vth is a threshold voltage of the gate, at which a channel is beginning to form.

The field-effect transportabilities of the organic thin-film transistors were $2.3 \times 10^{-3}$ cm$^2$/Vs, respectively as shown in FIG. 3.

The organic thin-film transistors had no variations between the elements and good reproducibilities.

Example 2

The procedure for preparation of the organic thin-film transistors in Example 1 was repeated to prepare two organic thin-film transistors except for mixing an organic semiconductive compound having the following formula

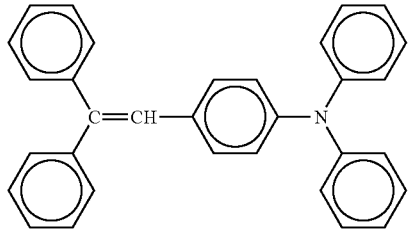

with the organic semiconductive compound in Example 1 such that the organic semiconductive compounds had a mixing ratio (Example 1/Example 2) of 6/4.

Figure 4:
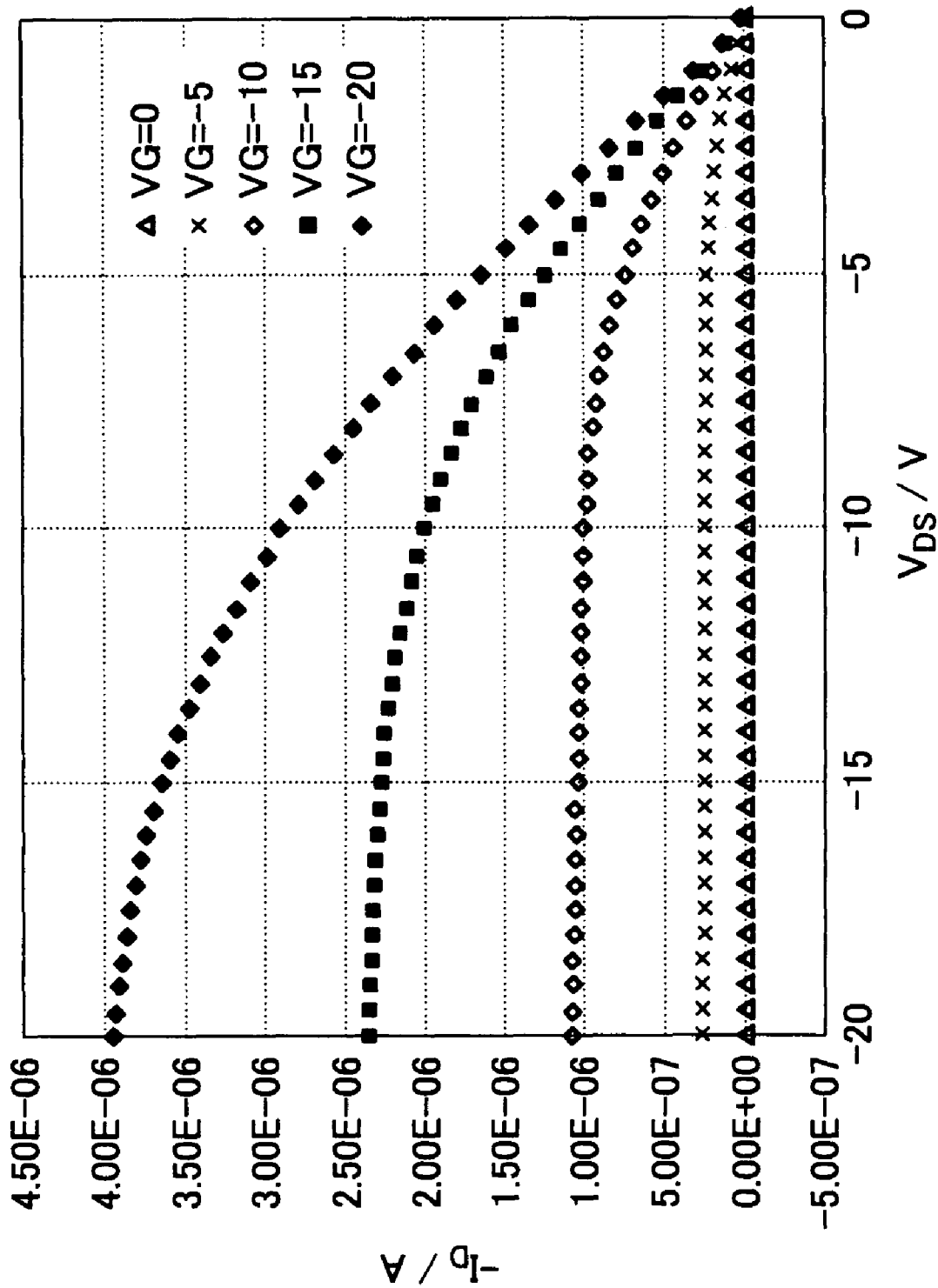
FIG. 4 is a schematic diagram illustrating a FET property of the organic thin-film transistor in Example 2.

The field-effect transportabilities of the organic thin-film transistors were $4.1 \times 10^{-3}$ cm$^2$/Vs, respectively as shown in FIG. 4.

The organic thin-film transistors had no variations between the elements and good reproducibilities.

Example 3

Figure 5:
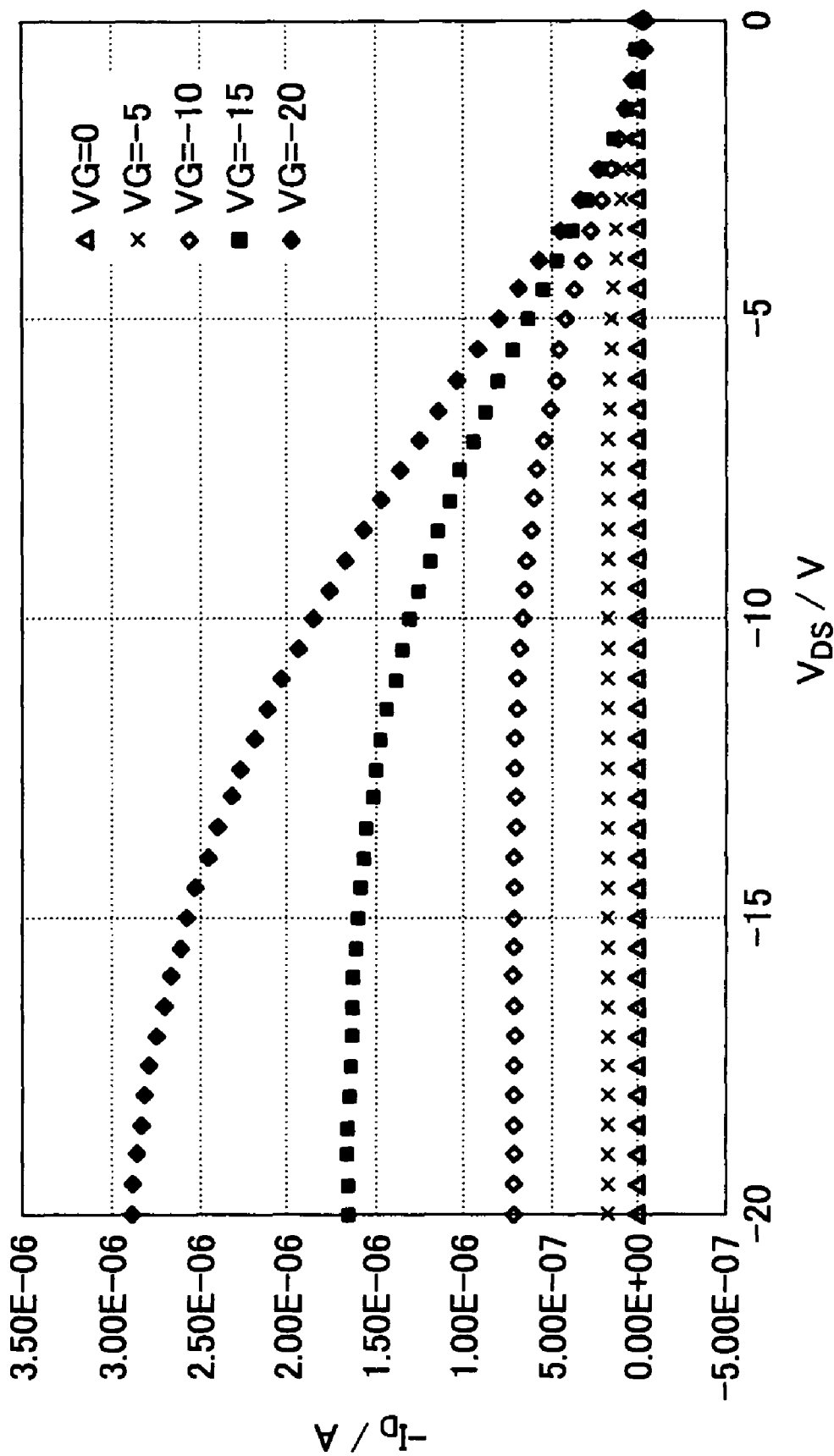
FIG. 5 is a schematic diagram illustrating a FET property of the organic thin-film transistor in Example 3.

The procedure for preparation of the organic thin-film transistors in Example 1 was repeated to prepare two organic thin-film transistors except that the substrate was dipped in a toluene solution including phenethyltrichlorosilane in an amount of 5 mM for 30 min while exposed with ultrasonic, and dried. The field-effect transportabilities of the organic thin-film transistors were $2.8 \times 10^{-3}$ cm$^2$/Vs, respectively as shown in FIG. 5.

Example 4

Figure 6:
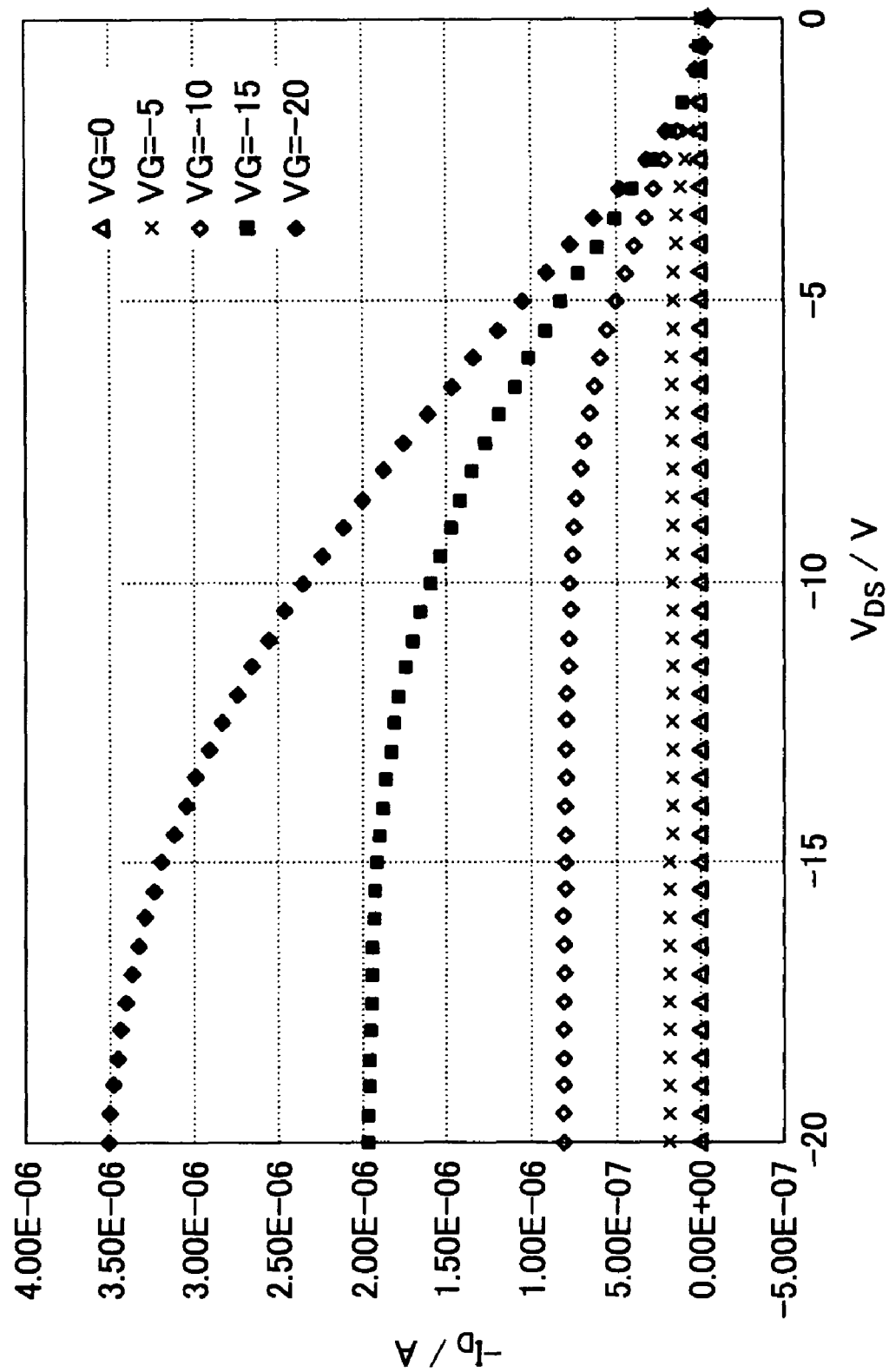
FIG. 6 is a schematic diagram illustrating a FET property of the organic thin-film transistor in Example 4.

The procedure for preparation of the organic thin-film transistors in Example 1 was repeated to prepare two organic thin-film transistors except that the substrate was dipped in a toluene solution including phenylbutyltrichlorosilane in an amount of 5 mM for 30 min while exposed with ultrasonic, and dried. The field-effect transportabilities of the organic thin-film transistors were $3.3 \times 10^{-3}$ cm$^2$/Vs, respectively as shown in FIG. 6.

Comparative Example 1

Figure 7:
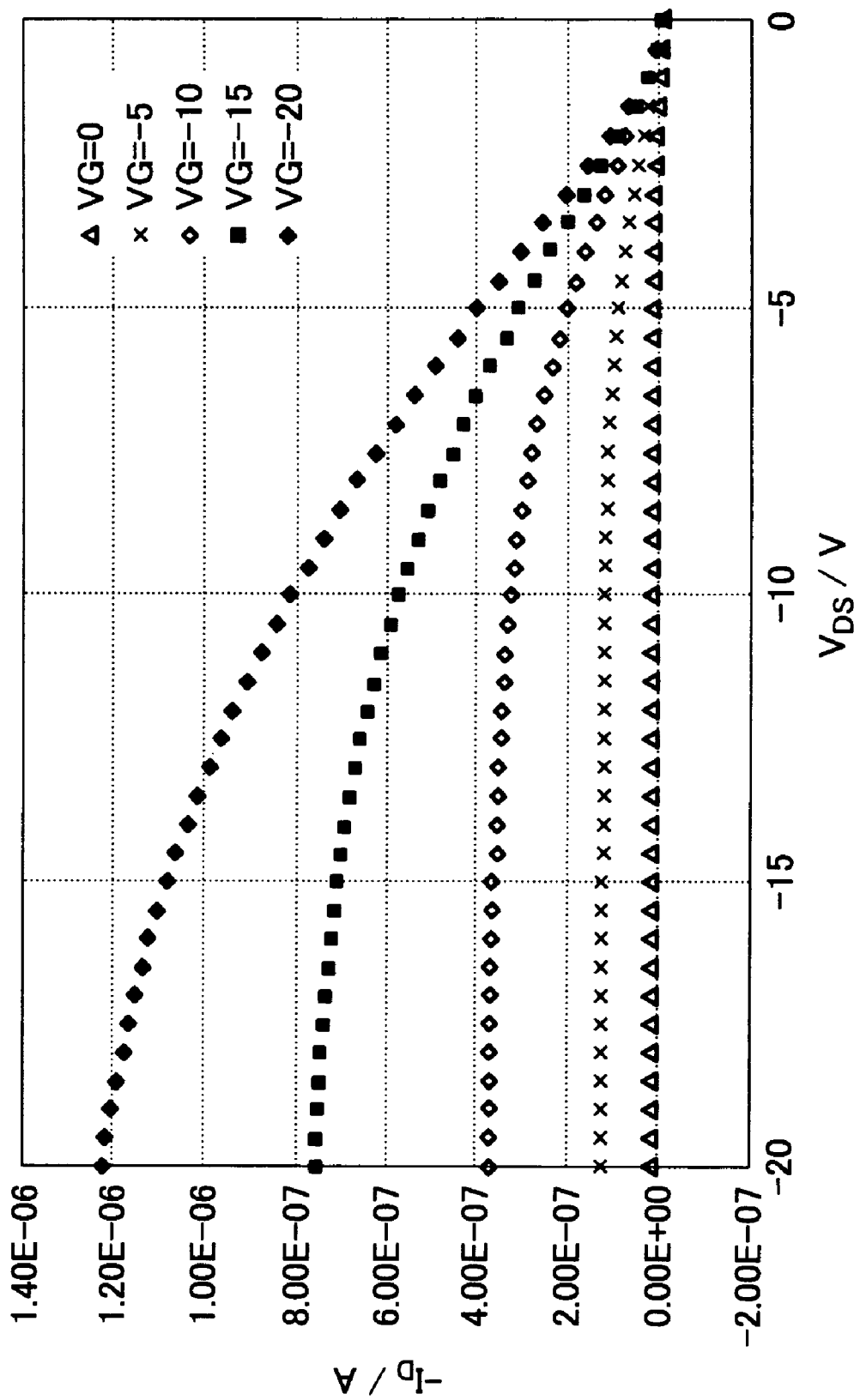
FIG. 7 is a schematic diagram illustrating a FET property of the organic thin-film transistor in Comparative Example 1.

The procedure for preparation of the organic thin-film transistors in Example 1 was repeated to prepare two organic thin-film transistors except that the SiO$_2$ insulating layer was surface-treated with hexamethyldisilazane. The field-effect transportabilities of the organic thin-film transistors were $8.1 \times 10^{-4}$ and $8.3 \times 10^{-4}$ cm$^2$/Vs, respectively as shown in FIG. 7.

Comparative Example 2

The procedure for preparation of the organic thin-film transistors in Example 1 was repeated to prepare an organic thin-film transistors except that the SiO$_2$ insulating layer was surface-treated with octadecylchlorosilane. However, an organic semiconductive layer including the organic semiconductive compound in Example 1 could not uniformly be formed. The organic semiconductive layer had a water contact angle of 108°, and a surface separation of 4.1±0.1 Å was formed thereon from the measurement result of the vision angle incident X-ray diffraction as shown in FIG. 2B.

Therefore, the organic thin-film transistor using a layer exposing a benzene ring, having a surface separation of from 2.8 to 3.0 Å has high reproducibility and transportability.

Namely, the organic thin-film transistor having high reproducibility and transportability can be prepare by simple processes with less variation.

This document claims priority and contains subject matter related to Japanese Patent Applications Nos. 2006-252019 and 2007-024998, filed on Sep. 19, 2006 and Feb. 5, 2007, respectively, the entire contents of which are herein incorporated by reference.

What is claimed is:

1. An organic thin-film transistor, comprising:
   a gate, a source and a drain;
   a layer exposing a plurality of benzene rings, adjacent ones of the benzene rings that face each other having a separation of from 2.8 Å to 3.0 Å;
   an organic semiconductive layer located overlying the layer exposing the plurality of benzene rings; and
   an insulating layer between said gate and said layer exposing the benzene rings, wherein
   the source and the drain are each formed on one of a top surface of the organic semiconductive layer and a top surface of the layer exposing the benzene rings,
   wherein said top surface of the layer exposing the benzene rings faces away from the gate, and
   wherein said top surface of the organic semiconductive layer faces away from the layer exposing the benzene rings.

2. The organic thin-film transistor of claim 1, wherein the layer exposing the plurality of benzene rings is formed on SiO$_2$.

3. The organic thin-film transistor of claim 2, wherein the plurality of benzene rings are exposed through an alkyl chain on SiO$_2$.

4. The organic thin-film transistor of claim 1, wherein the organic semiconductive layer comprises a compound having the following formula (I):

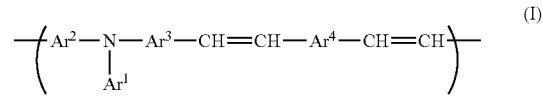

wherein Ar$^1$ represents a substituted or an unsubstituted monovalent aromatic hydrocarbon; Ar$^2$ and Ar$^3$ independently represent a substituted or an unsubstituted bivalent aromatic hydrocarbon; and Ar$^4$ represents a substituted or an unsubstituted aromatic hydrocarbon, or a substituted or an unsubstituted bivalent heterocyclic compound.

5. The organic thin-film transistor of claim 1, wherein the organic semiconductive layer comprises a compound having the following formula (II):

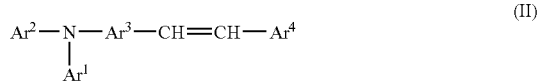

(II)

wherein $Ar^1$ represents a substituted or an unsubstituted monovalent aromatic hydrocarbon; and $Ar^2$ and $Ar^3$ independently represent a substituted or an unsubstituted bivalent aromatic hydrocarbon; and $Ar^4$ represents a substituted or an unsubstituted aromatic hydrocarbon, or a substituted or an unsubstituted bivalent heterocyclic compound.

6. The organic thin-film transistor of claim 1, wherein the organic semiconductive layer is formed on a silane compound film comprising a hydrolyzable group and an aromatic ring group.

7. The organic thin-film transistor of claim 1, wherein the source and the drain are each formed on the top surface of the organic semiconductive layer facing away from the layer exposing the benzene rings, and the source and the drain are each separated from the layer exposing the plurality of benzene rings by at least a portion of the organic semiconductive layer.

8. The organic thin-film transistor of claim 1, wherein the organic semiconductor layer has a thickness not greater than 1 μm.

9. The organic thin-film transistor of claim 1, wherein the organic semiconductor layer has a thickness from 5 nm to 200 nm.

10. The organic thin-film transistor of claim 1, wherein the layer exposing the plurality of benzene rings is formed by directly attaching each of the plurality of benzene rings to a siloxane compound and wherein the plurality of benzene rings are configured to face each other at intervals of Si—O—Si.

* * * * *